US012626748B2

(12) United States Patent
Lee et al.

(10) Patent No.: US 12,626,748 B2
(45) Date of Patent: May 12, 2026

(54) VOLTAGE GENERATOR AND MEMORY DEVICE INCLUDING SAME

(71) Applicant: SAMSUNG ELECTRONICS CO., LTD., Suwon-si (KR)

(72) Inventors: Dongil Lee, Suwon-si (KR); Younghun Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 18/388,569

(22) Filed: Nov. 10, 2023

(65) Prior Publication Data

US 2024/0170043 A1     May 23, 2024

(30) Foreign Application Priority Data

Nov. 14, 2022    (KR) ........................ 10-2022-0151535

(51) Int. Cl.
| | |
|---|---|
| *G05F 1/575* | (2006.01) |
| *G11C 11/4074* | (2006.01) |
| *G11C 11/4091* | (2006.01) |
| *H03K 19/20* | (2006.01) |

(52) U.S. Cl.
CPC .......... *G11C 11/4074* (2013.01); *G05F 1/575* (2013.01); *G11C 11/4091* (2013.01); *H03K 19/20* (2013.01)

(58) Field of Classification Search
CPC . G11C 11/4074; G11C 11/4091; G05F 1/575; H04K 19/20
See application file for complete search history.

(56) References Cited

U.S. PATENT DOCUMENTS

| | | | |
|---|---|---|---|
| 7,864,599 B2 | 1/2011 | Chang et al. | |
| 7,907,462 B2 | 3/2011 | Byeon | |
| 2005/0270868 A1 | 12/2005 | Im et al. | |
| 2007/0070726 A1 | 3/2007 | Jang et al. | |
| 2008/0138680 A1* | 6/2008 | Hu .................... | H01M 8/04947 |
| | | | 429/432 |
| 2013/0033244 A1* | 2/2013 | Ock .......................... | G05F 1/56 |
| | | | 323/280 |
| 2014/0056063 A1 | 2/2014 | Kajigaya | |
| 2014/0176098 A1 | 6/2014 | Fang et al. | |
| 2023/0131586 A1* | 4/2023 | Pedersen ............... | G06F 1/3296 |
| | | | 713/320 |

FOREIGN PATENT DOCUMENTS

| | | |
|---|---|---|
| KR | 0847760 | 7/2008 |
| KR | 0908814 | 7/2009 |
| KR | 1442174 | 9/2014 |

* cited by examiner

*Primary Examiner* — Min Huang
(74) *Attorney, Agent, or Firm* — Fish & Richardson P.C.

(57) ABSTRACT

A voltage generator including an LDO (low dropout) regulator that supplies a current to an internal voltage node of a sense amplification circuit as feedback control based on a voltage level of the internal voltage node; and a power switch circuit including a plurality of power switches each having one end connected to an external voltage and an opposite end connected to the internal voltage node, and that supplies the current to the internal voltage node as feedforward control based on a known number of sense amplifiers to be activated. The voltage generator may efficiently supply current according to an operation mode of the sense amplification circuit.

20 Claims, 16 Drawing Sheets

| Operation | Normal | Refresh |
|---|---|---|
| I_LOAD | Small | Large |
| Current Supply | LDO Regulator | Power Switch Circuit |

FIG.4B

| Mode | Precharging Mode | Offset Compensation Mode | Charge Sharing Mode | Sensing Mode | Restoring Mode |
|---|---|---|---|---|---|
| I_LOAD | Small | Large | Small | Large | Small |
| Current Supply | LDO Regulator | Power Switch Circuit | LDO Regulator | Power Switch Circuit | LDO Regulator |

FIG.7

| | VH | VM | VL | VLL |
|---|---|---|---|---|
| VREF_H<VEXT_DIV | 1 | 0 | 0 | 0 |
| VREF_M<VEXT_DIV<VREF_H | 1 | 1 | 0 | 0 |
| VREF_L<VEXT_DIV<VREF_M | 1 | 1 | 1 | 0 |
| VREF_LL<VEXT_DIV<VREF_L | 1 | 1 | 1 | 1 |

| VH | VM | VL | VLL |
|----|----|----|-----|
| 1  | 1  | 0  | 1   |

| VH_EN | VM_EN | VL_EN | VLL_EN |
|-------|-------|-------|--------|
| 1     | 1     | 0     | 0      |

VOLTAGE GENERATOR AND MEMORY DEVICE INCLUDING SAME

CROSS-REFERENCE TO RELATED APPLICATION

This application claims priority under 35 U.S.C. § 119 to Korean Patent Application No. 10-2022-0151535 filed on Nov. 14, 2022, in the Korean Intellectual Property Office, the disclosure of which is incorporated by reference herein in its entirety.

BACKGROUND

The present disclosure relates to voltage generators.

Semiconductor memory devices may be implemented using semiconductors such as silicon (Si), germanium (Ge), gallium arsenide (GaAs), indium phosphide (InP), and the like. Semiconductor memory devices may include volatile memory devices and nonvolatile memory devices.

A volatile memory device is a memory device in which stored data is lost when power supply is cut off. Volatile memory devices include static RAM (SRAM), dynamic RAM (DRAM), and synchronous DRAM (SDRAM) for example. In volatile memory, normal operations such as a read operation and a refresh operation of periodically rewriting the same data may be performed to maintain integrity of the stored data. In such volatile memory, it is necessary to quickly and stably compensate for the current consumed according to the operation mode.

SUMMARY

Embodiments of the inventive concepts provide a voltage generator capable of efficiently supplying current according to an operation mode, and a memory device including the same. According to the voltage generator of the inventive concepts, it is possible to efficiently supply current by a load block such as a sense amplifier according to an operation mode.

Embodiments of the inventive concepts provide a voltage generator including an LDO regulator that supplies a first current to an internal voltage node of a sense amplification circuit as feedback control based on a voltage level of the internal voltage node; and a power switch circuit including a plurality of power switches each having one end connected to an external voltage and an opposite end connected to the internal voltage node, and that supplies a second current to the internal voltage node as feed-forward control based on a number of activated sense amplifiers of the sense amplification circuit.

Embodiments of the inventive concepts further provide a memory device including a memory cell array including a plurality of memory cells; a sense amplification circuit that reads out data stored in the memory cell array; and an internal voltage generator that provides an internal voltage to the sense amplification circuit. The internal voltage generator compensates for a current consumed by the sense amplification circuit by respectively using feedback control and feed-forward control according to an operation mode of the sense amplification circuit.

Embodiments of the inventive concepts still further provide a load block; and an internal voltage generator that provides a current consumed by the load block. The internal voltage generator compensates for the current consumed by the load block by selectively using feedback control and feed-forward control according to an operation mode of the load block.

BRIEF DESCRIPTION OF THE DRAWINGS

The above and other objects and features of the present disclosure will be more clearly understood from the following detailed description taken in conjunction with the accompanying drawings.

FIG. 3 is a diagram illustrating an example of an internal voltage generator 1800 of FIG. 1.

FIGS. 4A and 4B are diagrams illustrating an example of an operation of an internal voltage generator 1800A of FIG. 3 in an operation mode.

FIG. 7 illustrates voltages of internal voltage generator 1800B described with respect to FIG. 6.

FIG. 10 illustrates a diagram of mode selector 1824 of FIG. 5.

FIG. 12 illustrates a diagram of an example of an internal voltage generator 1800C according embodiments of the inventive concepts.

FIG. 15 illustrates a diagram of operation of error corrector 1827 of FIG. 14.

DETAILED DESCRIPTION

Hereinafter, various embodiments will be described with reference to the accompanying drawings. As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
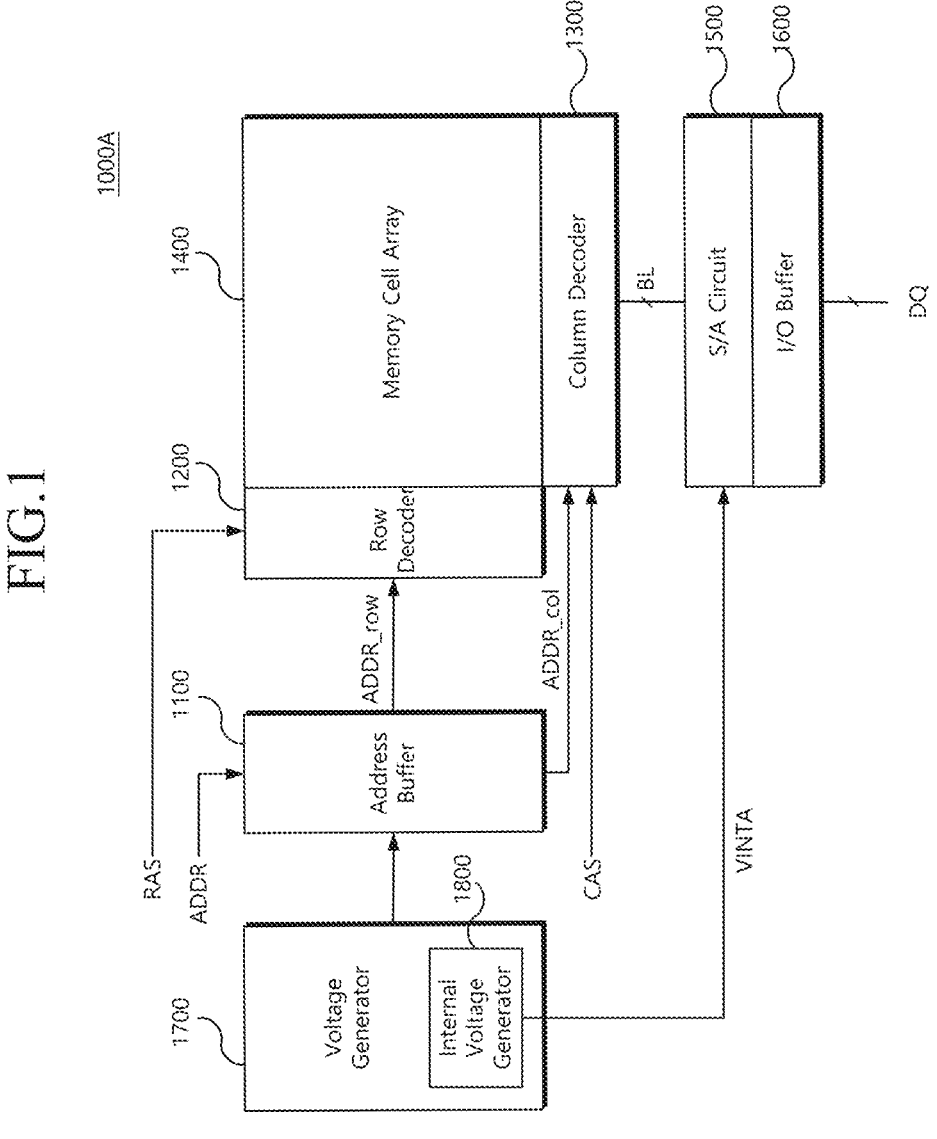
FIG. 1 is a block diagram illustrating a memory device 1000A according to embodiments of the inventive concepts.

FIG. 1 illustrates a block diagram of a memory device 1000A according to embodiments of the inventive concepts.

The memory device 1000A according to embodiments of the inventive concepts may compensate for a current consumed by a sense amplification circuit 1500 according to an operation mode in a feed-forward manner or a feedback manner. In particular, the memory device 1000A may quickly compensate for the current consumed by the sense amplification circuit 1500 by providing a current in a feed-forward manner in an operation mode in which current consumption is great.

Referring to FIG. 1, the memory device 1000A may be a storage device including semiconductor memory devices. For example, the memory device 1000A may include random access memory (RAM) such as a dynamic random access memory (DRAM), synchronous DRAM (SDRAM), static RAM (SRAM), double date rate SDRAM (DDR SDRAM), DDR2 SDRAM, DDR3 SDRAM, phase-change RAM (PRAM), magnetic RAM (MRAM), resistive RAM (RRAM), and the like.

The memory device 1000A may output data through data lines DQ in response to an address ADDR and control signals RAS and CAS received from an external device (e.g., a memory controller). The memory device 1000A may include address buffer 1100, row decoder 1200, column decoder 1300, memory cell array 1400, sense amplification (S/A) circuit 1500, input/output (I/O) buffer 1600, voltage generator 1700, and internal voltage generator 1800.

The address buffer 1100 may receive an address ADDR from an external device (e.g., a memory controller). The address ADDR includes a row address ADDR_row indicating a row of the memory cell array 1400 and a column address ADDR_col indicating a column of the memory cell array 1400. The address buffer 1100 may transmit the row address ADDR_row to the row decoder 1200. The address buffer 1100 may transmit the column address ADDR_col to the column decoder 1300.

The row decoder 1200 may select one of a plurality of word lines connected to the memory cell array 1400. For example, the row decoder 1200 may receive the row address ADDR_row from the address buffer 1100. The row decoder 1200 may select one word line corresponding to the received row address ADDR_row among the plurality of word lines. The row decoder 1200 may activate the selected word line in response to the control signal RAS.

The column decoder 1300 may select one bit line from a plurality of bit lines BL connected to the memory cell array 1400. For example, the column decoder 1300 may receive the column address ADDR_col from the address buffer 1100. The column decoder 1300 may select one bit line corresponding to the received column address ADDR_col from among the plurality of bit lines BL. The column decoder 1300 may activate the selected bit line in response to the control signal CAS.

The memory cell array 1400 may include a plurality of memory cells. The plurality of memory cells may be located at points where a plurality of word lines and a plurality of bit lines intersect. The plurality of memory cells are connected to the plurality of word lines and the plurality of bit lines. The plurality of memory cells may be provided in a matrix form. The plurality of word lines may be connected to the rows of the memory cells of the memory cell array 1400. The plurality of bit lines may be connected to columns of the memory cells of the memory cell array 1400.

The sense amplification circuit 1500 is connected to the plurality of bit lines connected to the memory cell array 1400. The sense amplification circuit 1500 may include a plurality of sense amplifiers, and the plurality of sense amplifiers may detect a voltage change of a corresponding bit line, amplify the voltage change, and output the amplified change.

The input/output buffer 1600 may output data to an external device through the data lines DQ based on the voltage amplified by the sense amplification circuit 1500.

The voltage generator 1700 may generate various voltages for operation of the memory device 1000A. For example, the voltage generator 1700 may generate voltages (e.g., VTG, VISO, and Vpre) for a refresh operation and provide the generated voltages to the address buffer 1100.

The internal voltage generator 1800 may generate an internal voltage VINTA for the operation of the sense amplification circuit 1500. For example, the internal voltage generator 1800 may provide the internal voltage VINTA to the sense amplification circuit 1500 through an internal voltage node, and the internal voltage generator 1800 may maintain a constant voltage level of the internal voltage node. Accordingly, the load current provided to the sense amplification circuit 1500 may be stably maintained at a constant level.

In embodiments of the inventive concepts, the internal voltage generator 1800 may include a low dropout (LDO) regulator operating in a feedback manner and a power switch circuit operating in a feed-forward manner.

For example, when the current consumption in the sense amplification circuit 1500 is large as in an offset compensation mode or sensing mode in a refresh operation, the internal voltage generator 1800 may provide a current to the sense amplification circuit 1500 in a feed-forward manner. Accordingly, the current consumed by the sense amplification circuit 1500 may be quickly compensated. In this case, the amount of current provided in the feed-forward manner may be controlled based on the number of word lines to be activated or the number of sense amplifiers to be activated.

As another example, when the current consumed by the sense amplification circuit 1500 is small as in a precharge mode and a restore mode in a normal operation or a refresh operation, the internal voltage generator 1800 may provide a current to the sense amplification circuit 1500 in a feedback manner. Accordingly, the sense amplification circuit 1500 may stably operate.

As described above, the memory device 1000A according to embodiments of the inventive concepts may provide a current to the sense amplification circuit 1500 in one of a feed-forward mode or a feedback mode according to an operation mode. The current may be adjusted according to the operation mode of the sense amplification circuit 1500 and may be provided to the sense amplification circuit 1500.

In particular, in an operation mode in which current consumption is large as in an offset compensation mode or a sensing mode in a refresh operation, the memory device 1000A according to embodiments of the inventive concepts may adjust the amount of current provided to the sense amplification circuit 1500 based on the number of sense amplifiers to be activated or the number of word lines to be activated that may be predetermined in advance. Accordingly, the current consumed by the sense amplification circuit 1500 may be quickly compensated.

Figure 2:
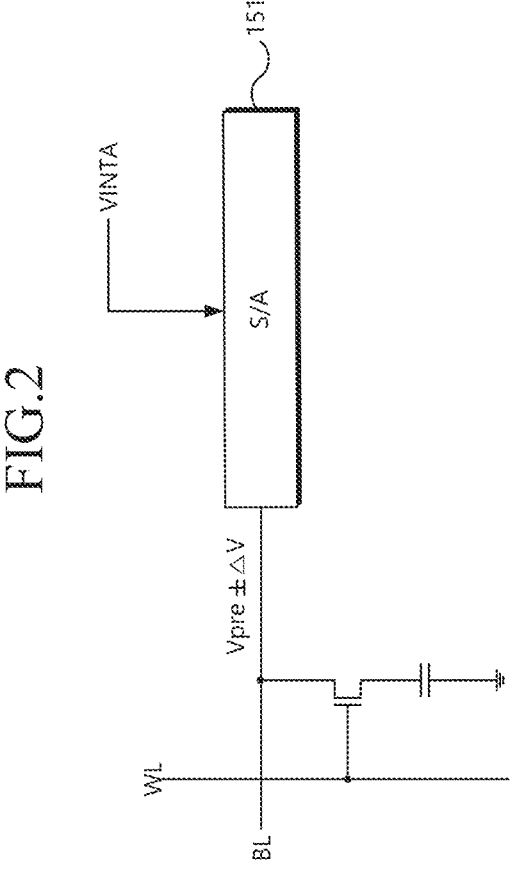
FIG. 2 is a diagram illustrating a bit line voltage sensing operation of a sense amplification circuit 1500 shown in FIG. 1.

FIG. 2 is a diagram illustrating a bit line voltage sensing operation of the sense amplification circuit 1500 shown in FIG. 1. For concise description, components other than the sense amplifier S/A, the bit line BL, the word line WL, and the memory cell MC will be omitted. In addition, the bit line voltage sensing operation will be described with respect to a refresh operation of the memory device 1000A. However, embodiments of the inventive concepts are not limited thereto, and the bit line sensing operation may also be applied to a read operation of the memory device 1000A.

Referring to FIGS. 1 and 2, the memory device 1000A may perform a refresh operation based on the charge amount of the capacitor included in the memory cell MC. The memory cell MC may include a transistor and capacitor as shown in FIG. 2 connected to a corresponding word line WL and a corresponding bit line BL that is connected to a sense amplifier (S/A) 1510 of sense amplification circuit 1500.

For example, a precharging operation of precharging the bit line BL connected to the memory cell MC with the precharge voltage Vpre may be performed. Then, in order to reduce noise such as sense amplifier offset noise, an offset compensation operation may be performed. The offset compensation operation may be performed through, for example, a diode connection technique. Thereafter, as the word line WL is activated, a charge sharing operation may be performed in which charges are shared between the bit line BL charged to the precharge voltage Vpre and the capacitor of the memory cell MC. Due to the charge sharing, the voltage level of the bit line BL may decrease or increase by a voltage variation ΔV to Vpre±ΔV. The sense amplifier S/A 1510 may perform a sensing operation of sensing and amplifying the voltage variation ΔV. Thereafter, a restoring operation may be performed in which the voltage level of the bit line BL increases or decreases.

The sense amplification circuit 1500 may include a plurality of sense amplifiers S/A, which correspond to one word line. For example, N sense amplifiers S/A (where N is an integer) may correspond to one word line. That is, a plurality of sense amplifiers S/A 1510 may be connected to sense the voltage variations ΔV of corresponding bit lines BL when one word line WL is activated.

In an embodiment, one word line may be activated during a normal operation such as a read operation, and M word lines (where M is an integer) may be activated during a refresh operation. In this case, N sense amplifiers S/A may be activated to consume current during the normal operation, and (M×N) sense amplifiers S/A may be activated to consume current during the refresh operation. Accordingly, the amount of current consumed by the sense amplification circuit 1500 during the refresh operation may be greater than the amount of current consumed by the sense amplification circuit 1500 during the normal operation. Accordingly, the internal voltage generator 1800 may provide a larger amount of current during the refresh operation.

In an embodiment, the sense amplifiers S/A may be driven when the offset compensation mode or the sensing mode among the precharge mode, offset compensation mode, charge sharing mode, and restore mode included in the refresh operation is performed. Accordingly, the amount of current consumed by the sense amplification circuit 1500 in the offset compensation mode or the sensing mode may be greater than the amount of current consumed by the sense amplification circuit 1500 in the precharge mode or the restore mode. Therefore, the internal voltage generator 1800 will provide a larger amount of current in the offset compensation or sensing mode.

Figure 3:
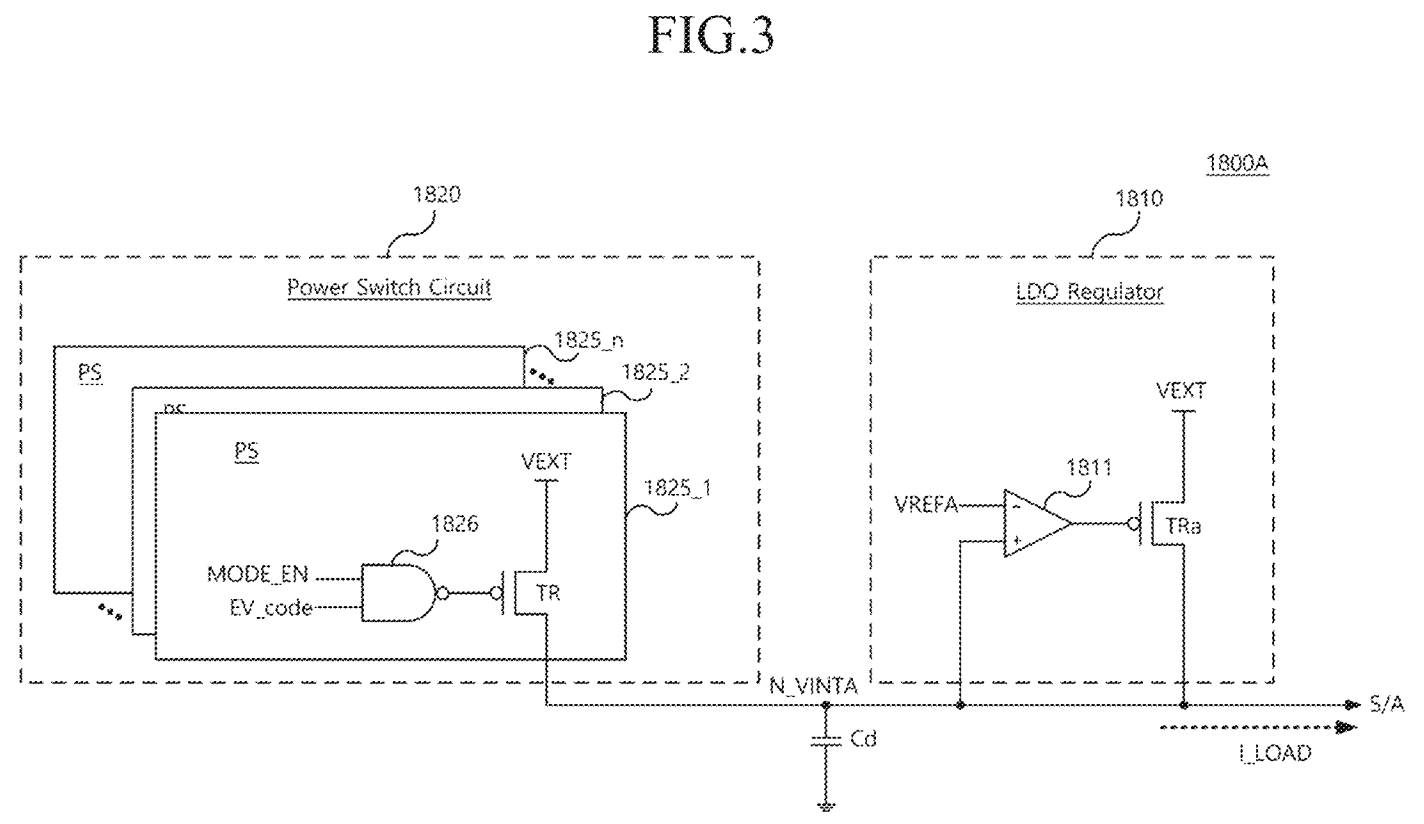

FIG. 3 illustrates a diagram of an example of internal voltage generator 1800 of FIG. 1.

Referring to FIG. 3, the internal voltage generator 1800A may include an LDO regulator 1810 and a power switch circuit 1820.

The LDO (low-dropout) regulator 1810 may be implemented to operate in a feedback manner. For example, as shown in FIG. 3, the LDO regulator 1810 may be implemented to include a comparator 1811 and a transistor TRa. However, the configuration of the LDO regulator 1810 as shown in FIG. 3 is illustrative only, and other embodiments are not limited to the configuration shown.

A first input terminal (e.g., the + input terminal) of the comparator 1811 may be connected to an internal voltage node N_VINTA. A reference voltage VREFA may be provided to a second input terminal (e.g., the – input terminal) of the comparator 1811. The comparator 1811 may compare the voltage level of the internal voltage node N_VINTA with the reference voltage VREFA and output the comparison result.

The transistor TRa may electrically connect an external voltage VEXT to the internal voltage node N_VINTA in response to the comparison result of the comparator. For example, when the voltage level of the internal voltage node N_VINTA decreases due to the current consumption in the sense amplifier S/A, the transistor TRa may be turned on to provide the external voltage VEXT to the internal voltage node N_VINTA.

As described above, based on the voltage level change of the internal voltage node N_VINTA according to the current consumption of the sense amplifier S/A, the LDO regulator 1810 may provide the external voltage VEXT to the internal voltage node N_VINTA. In other words and for example, the LDO regulator 1810 may be characterized as supplying a first current to the internal voltage node N_VINTA of sense amplification circuit 1500 as feedback control generated based on a voltage level of internal voltage node N_VINTA of the sense amplifier circuit 1500.

The power switch circuit 1820 may be implemented to operate in a feed-forward manner. Illustratively, as shown in FIG. 3, the power switch circuit 1820 may include a plurality of power switches 1825_1 to 1825_n, and each power switch may be implemented to include a NAND gate 1826 and a transistor TR. However, this is illustrative, and the configuration of the power switch circuit 1820 according to the inventive concepts is not limited thereto.

The NAND gate 1826 may receive a mode enable signal MODE_EN. In this case, the mode enable signal MODE_EN may be a signal activated based on the operation mode of the memory device 1000A.

In an embodiment, the mode enable signal MODE_EN may be activated when the current consumed by the sense amplification circuit 1500 is relatively large. For example, the mode enable signal MODE_EN may be activated in a refresh operation in which the current consumption is larger than in the normal operation. As another example, in the refresh operation, the mode enable signal MODE_EN may be activated in an offset compensation operation or a sensing operation in which current consumption is larger than in the precharge operation or restore operation.

The NAND gate 1826 may receive an external voltage code EV_code. In this case, the external voltage code EV_code may be a code used to determine the number of turned-on power switches. The external voltage code EV_code may be set based on the perceived number of sense amplifiers to be activated or the number of word lines to be activated. For example, the power switch circuit 1820 may be characterized as supplying a second current to the internal voltage node N_VINTA of sense amplification circuit 1500 as feed-forward control generated based on a predetermined number of activated sense amplifiers of the sense amplifier circuit 1500.

In an embodiment, the external voltage code EV_code may be set (or activated) to turn on more power switches as the number of sense amplifiers to be activated or the number of word lines to be activated increases. For example, it is assumed that 8 word lines are activated in the first refresh operation and 16 word lines are activated in the second refresh operation. In this case, the external voltage code EV_code may be set such that the number of power switches to be turned on in the second refresh operation is double or similar to that compared to the first refresh operation.

In an embodiment, the internal voltage generator 1800A may include a decoupling capacitor Cd. For example, the decoupling capacitor Cd may be provided to minimize a change in the voltage level of the internal voltage node N_VINTA.

In the case of a general internal voltage generator, the decoupling capacitor Cd should be implemented as a large-capacity capacitor in order to minimize the variation of the internal voltage VINTA, which is the output voltage. However, the internal voltage generator 1800A according to embodiments of the inventive concepts may compensate for current consumption in a feed-forward manner in an operation mode in which current consumption is high. Therefore, in the internal voltage generator 1800A according to embodiments of the inventive concepts, the decoupling capacitor Cd may be excluded or may be included as having a small capacity.

FIGS. 4A and 4B illustrate diagrams explanatory of an example of an operation of the internal voltage generator 1800A of FIG. 3 in an operation mode.

Referring to FIG. 4A, the amount of load current I_LOAD that may be required by the sense amplification circuit 1500 in the refresh operation is greater than that of load current I_LOAD that may be required by the sense amplification circuit 1500 in the normal operation such as a read operation. In this case, in the normal operation the LDO regulator 1810 may provide the load current I_LOAD in a feedback manner, and in the refresh operation the power switch circuit 1820 may provide the load current I_LOAD in a feed-forward manner.

Referring to FIG. 4B, in the refresh operation, the amount of load current I_LOAD that may be required by the sense amplification circuit 1500 in the offset compensation or sensing mode is greater than that of load current I_LOAD that may be required by the sense amplification circuit 1500 in the precharge mode and the restore mode. In this case, in the precharge mode and the restore mode, the LDO regulator 1810 may provide the load current I_LOAD in the feedback manner, and in the offset compensation or sensing mode, the power switch circuit 1820 may provide the load current I_LOAD in the feed-forward manner.

As described above, when the current consumption of the sense amplification circuit 1500 is large, the current consumption may be quickly compensated through the feed-forward type power switch circuit 1820. When the current consumption of the sense amplification circuit 1500 is small, the current consumption may be stably compensated through the feedback type LDO regulator 1810. Accordingly, the current required by the sense amplification circuit 1500 may be efficiently provided.

It should be understood that the above description is illustrative, and that the inventive concepts are not limited thereto. For example, the internal voltage generator 1800 according to embodiments of the inventive concepts may be implemented or modified in various forms. Hereinafter, various modified examples of the internal voltage generator 1800 according to the inventive concepts will be described in more detail.

Figure 5:
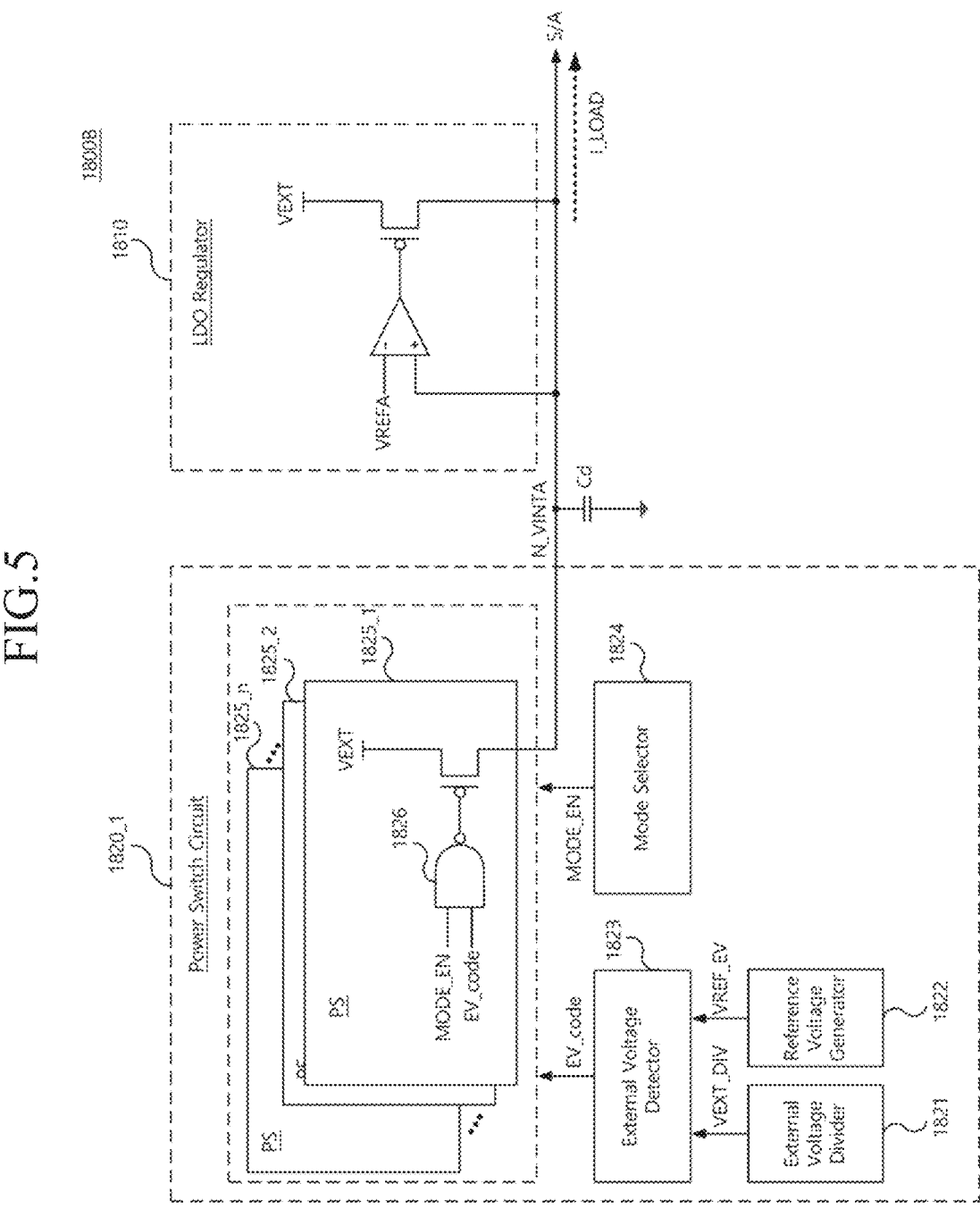
FIG. 5 is a diagram of another example of internal voltage generator 1800 of FIG. 1.

FIG. 5 illustrates a diagram of another example of internal voltage generator 1800 of FIG. 1. Internal voltage generator 1800B of FIG. 5 is similar to the internal voltage generator 1800A of FIG. 3. Therefore, the same or similar components will be denoted by the same or similar reference numerals, and redundant description will be omitted hereinafter.

As illustrated in FIGS. 1 to 4, the internal voltage generator 1800B according to other embodiments of the inventive concepts may provide a current to the sense amplification circuit 1500 through a feed-forward manner or a feedback manner according to an operation mode. In particular, when the current is provided in a feed-forward manner, the number of power switches to be turned on may be determined based on the perceived number of sense amplifiers to be activated or the number of word lines to be activated.

In addition, the internal voltage generator 1800B according to embodiments of the inventive concepts may additionally adjust the number of power switches to be turned on in consideration of characteristics (e.g., a threshold voltage) between devices due to external voltage fluctuations or process variations, operating temperature (process variation temperature (PVT)), and the like. Illustratively, an example will hereinafter be described in which the number of power switches turned-on is adjusted according to an external voltage variation.

Referring to FIG. 5, the internal voltage generator 1800B may include an LDO regulator 1810 and a power switch circuit 1820_1, and the power switch circuit 1820_1 may include an external voltage divider 1821, a reference voltage generator 1822, an external voltage detector 1823, a mode selector 1824, and a plurality of power switches 1825_1 to 1825_n.

The external voltage divider 1821 may receive and divide the external voltage VEXT. The external voltage divider 1821 may provide a divided external voltage VEXT_DIV to the external voltage detector 1823.

The reference voltage generator 1822 may generate at least one reference voltage. The reference voltage generator 1822 may provide a reference voltage VREF_EV to the external voltage detector 1823.

The external voltage detector 1823 may receive the divided external voltage VEXT_DIV and the reference voltage VREF_EV. The external voltage detector 1823 may compare the external voltage VEXT_DIV with the reference voltage VREF_EV to generate the external voltage code EV_code. In this case, the external voltage code EV_code may be used to adjust the number of additionally turned-on power switches according to the variation of the external voltage VEXT. The external voltage detector 1823 may provide the external voltage code EV_code to the plurality of power switches 1825_1 to 1825_n. For example, in some embodiments the external voltage code EV_code may be a multi-bit code having n bits.

The mode selector 1824 may selectively activate the mode enable signal MODE_EN according to an operation mode. In an embodiment, the mode selector 1824 may activate the mode enable signal MODE_EN when the mode selector 1824 executes the operation mode in which the current consumption in the sense amplification circuit 1500 (see FIG. 1) is large. For example, when the refresh operation is performed in the offset compensation or sensing mode, the mode selector 1824 may activate the mode enable signal MODE_EN.

Each of the plurality of power switches 1825_1 to 1825_n may receive the external voltage code EV_code and the mode enable signal MODE_EN. The number of power switches turned on among the plurality of power switches 1825_1 to 1825_n may be determined based on the external voltage code EV_code and the mode enable signal MODE_EN.

In embodiments of the inventive concepts, the number of power switches to be turned on among the plurality of power switches 1825_1 to 1825_n may be primarily determined based on the perceived number of sense amplifiers to be activated or the number of word lines to be activated. Then, the number of additionally turned-on or turned-off power switches among the plurality of power switches 1825_1 to 1825_n may be secondarily determined based on the variation of the external voltage VEXT. In this case, the external voltage code EV_code may be set by reflecting not only the number of sense amplifiers to be activated or the number of word lines to be activated, but also the variation of the external voltage VEXT. As a result, despite the variation of the external voltage VEXT, the supply of current in the feed-forward manner may be stably maintained.

Figure 6:
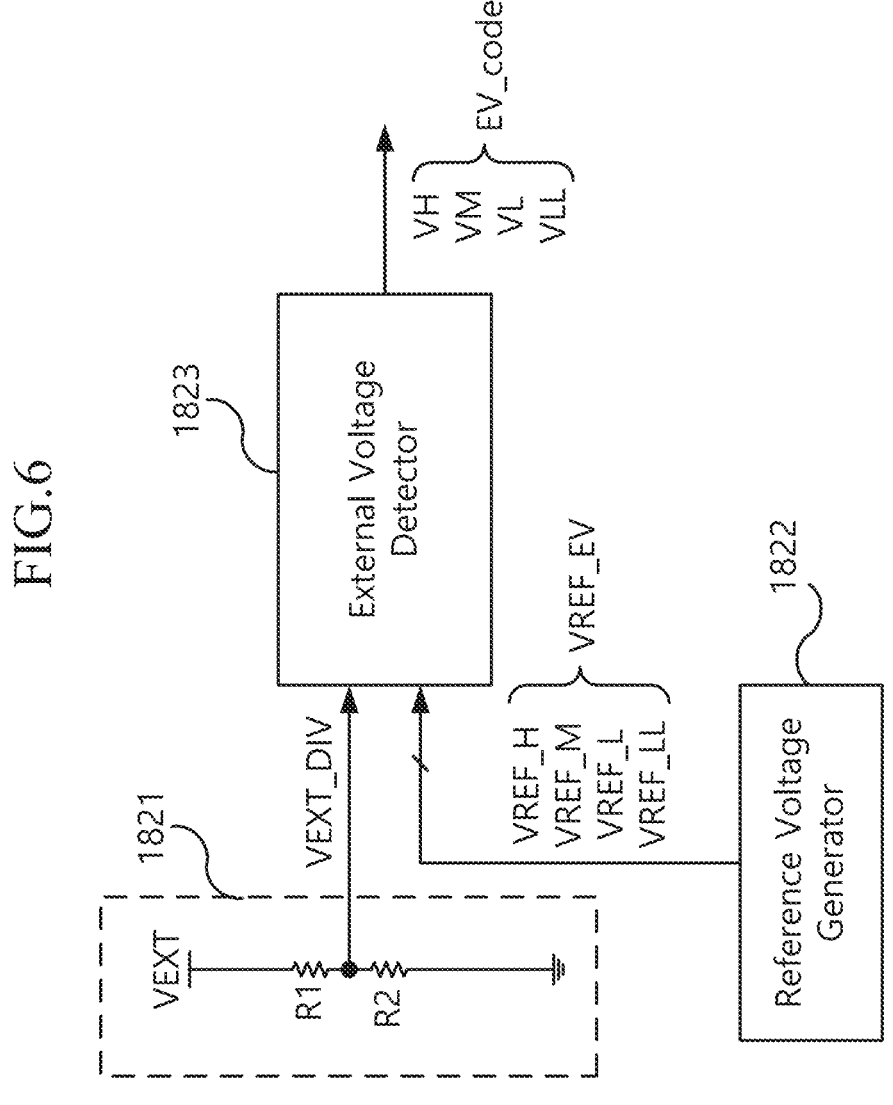
FIG. 6 illustrates a diagram of an example operation of an internal voltage generator 1800B of FIG. 5.

FIGS. 6 and 7 illustrate diagrams explanatory of an example operation of the internal voltage generator 1800B of FIG. 5. For convenience of description, hereinafter it is assumed that the number of power switches to be turned on among the plurality of power switches 1825_1 to 1825_n is primarily determined based on the perceived number of sense amplifiers to be activated or the number of word lines to be activated. That is, with respect to FIGS. 6 and 7, it is hereinafter assumed that the number of turned-on power switches is adjusted according to the variation of the external voltage VEXT. In addition, for convenience of explanation, it is assumed that four power switches are additionally turned on or turned off according to the variation of the external voltage VEXT.

First, referring to FIG. 6, the external voltage divider 1821 may include resistors R1 and R2 connected in series, and may receive the external voltage VEXT, divide the external voltage Vext and correspondingly distribute the divided external voltage VEXT_DIV. The external voltage divider 1821 may provide the divided external voltage VEXT_DIV to the external voltage detector 1823.

The reference voltage generator 1823 may generate the reference voltage VREF_EV. For example, the reference voltage VREF_EV may include a first reference voltage VREF_H, a second reference voltage VREF_M, a third reference voltage VREF_L, and a fourth reference voltage VREF_LL. The reference voltage generator 1823 may provide the first to fourth reference voltages VREF_H, VREF_M, VREF_L, and VREF_LL to the external voltage detector 1823.

The external voltage detector 1823 may compare the divided external voltage VEXT_DIV with the first to fourth reference voltages VREF_H, VREF_M, VREF_L, and VREF_LL. The external voltage detector 1823 may generate an external voltage code EV_code based on the comparison result. The external voltage code EV_code may include, for example, a first external voltage code VH, a second external voltage code VM, a third external voltage code VL, and a fourth external voltage code VLL. Each of the first to fourth external voltage codes VH, VM, VL, and VLL may be provided to a corresponding power switch, and thus the power switches may be turned on or off.

Referring to FIG. 7, in an embodiment, the divided external voltage VEXT_DIV may for example be greater than the first reference voltage VREF_H. In this case, the first external voltage code VH may be set to '1', and the remaining external voltage codes VM, VL, and VLL may be set to '0'. Accordingly, one power switch may additionally be turned on.

In an embodiment, the divided external voltage VEXT_DIV may for example be lower than the first reference voltage VREF_H and higher than the second reference voltage VREF_M. In this case, the first and second external voltage codes VH and VM may be set to '1', and the third and fourth external voltage codes VL and VLL may be set to '0'. Accordingly, two power switches may additionally be turned on.

In an embodiment, the divided external voltage VEXT_DIV may for example be lower than the second reference voltage VREF_M and higher than the third reference voltage VREF_L. In this case, the first to third external voltage codes VH, VM, and VL may be set to '1', and the fourth external voltage code VLL may be set to '0'. Accordingly, three power switches may additionally be turned on.

In an embodiment, the divided external voltage VEXT_DIV may for example be lower than the third reference voltage VREF_L and higher than the fourth reference voltage VREF_LL. In this case, all of the first to fourth external voltage codes VH, VM, VL and VLL may be set to '1'. Accordingly, four power switches may additionally be turned on.

As described above, the external voltage code EV_code may be set by reflecting the variation of the external voltage VEXT. Accordingly, even when the external voltage VEXT is changed, current supply in the feed-forward mode may be stably maintained.

Figure 8:
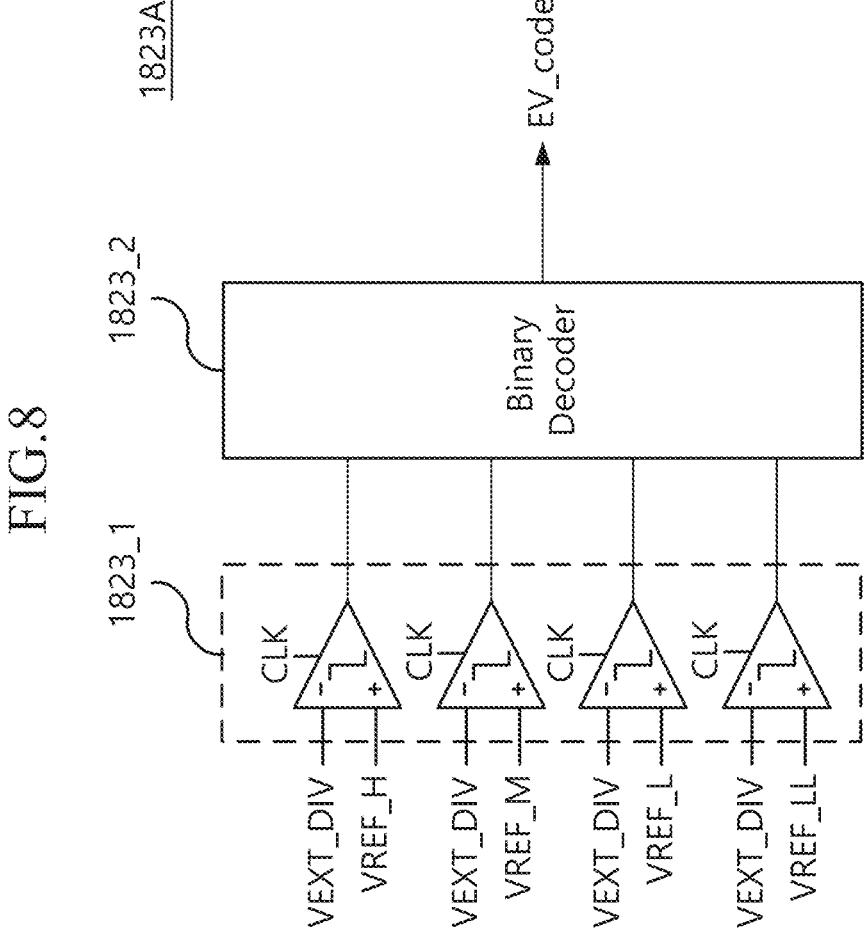
FIG. 8 illustrates a diagram of an example of external voltage detector 1823 of FIG. 5.
Figure 9:
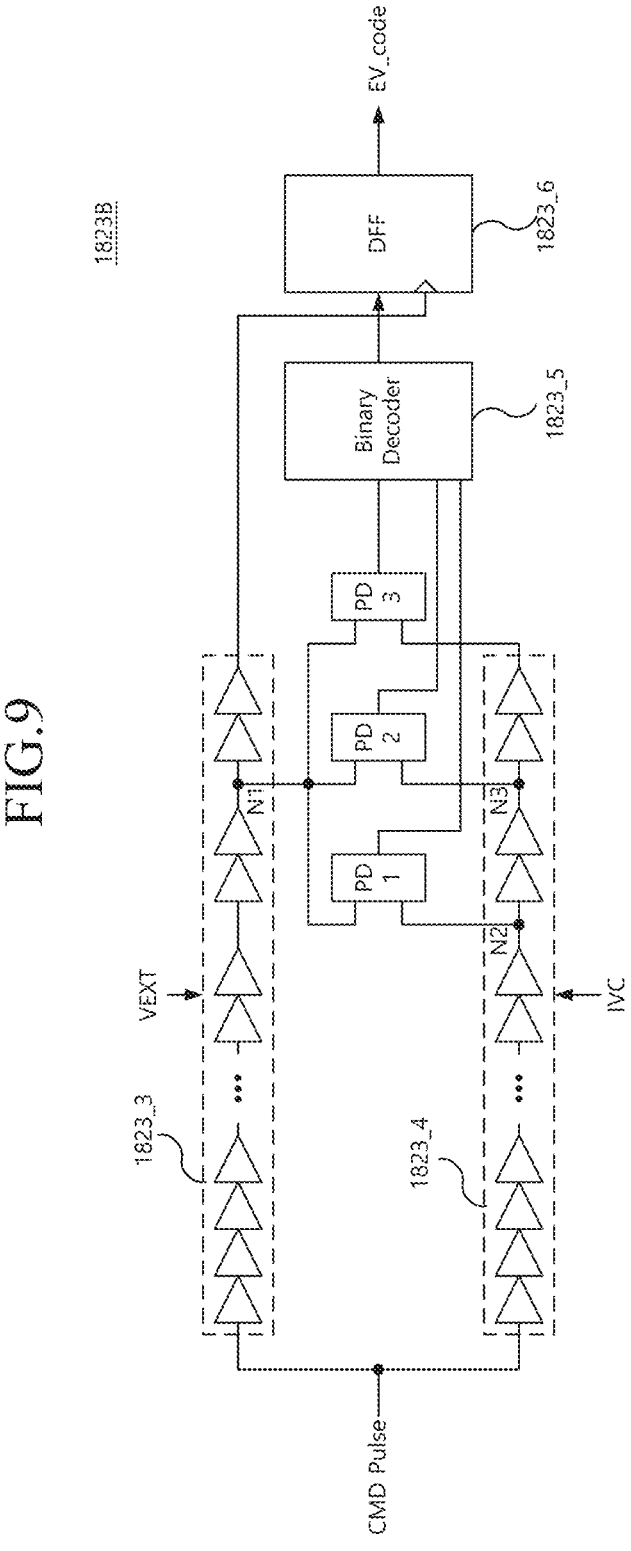
FIG. 9 illustrates a diagram of another example of external voltage detector 1823 of FIG. 5.

FIGS. 8 and 9 illustrate diagrams of examples of external voltage detector 1823 of FIG. 5. In detail, FIG. 8 illustrates an example of an external voltage detector 1823A implemented in the form of an analog to digital converter (ADC). FIG. 9 illustrates an example of an external voltage detector 1823B implemented in the form of a time to digital converter (TDC). For convenience of explanation, it is assumed that four power switches are additionally turned on or turned off according to a variation of the external voltage VEXT, as in FIGS. 6 and 7.

Accordingly, the external voltage detector 1823 according to embodiments of the inventive concepts may be implemented in various forms. For example, as shown in FIGS. 8 and 9, the external voltage detector 1823 may be implemented in the form of an ADC or in the form of a TDC. However, is the external voltage detectors in FIGS. 8 and 9 are illustrative, and in other embodiments should not be limited thereto.

In more detail with reference to FIG. 8, the external voltage detector 1823A implemented in ADC form may include a comparison unit 1823_1 and a binary decoder 1823_2.

The comparison unit 1823_1 may be implemented to include a plurality of comparators. Each of the plurality of comparators operates in synchronization with a clock signal CLK, and may compare the divided external voltage VEXT_DIV with a corresponding reference voltage among the first to fourth reference voltages VREF_H, VREF_M, VREF_L, and VREF_LL. The binary decoder 1823_2 may receive a comparison result from the comparison unit 1823_1 and output it as a binary external voltage code EV_code.

Referring to FIG. 9, the external voltage detector 1823B implemented in TDC form may include a first delay line 1823_3, a second delay line 1823_4, first to third phase detectors PD1 to PD3, a binary decoder 1823_5, and a D-flip-flop 1823_6.

The first delay line 1823_3 may include a plurality of delay cells. A command pulse CMD Pulse may be provided as an input of the first delay line 1823_3, and the external voltage VEXT may be provided as a control voltage. Accordingly, a delay corresponding to the external voltage VEXT may occur with respect to the command pulse CMD Pulse. Here, the external voltage (VEXT) may correspond to the external voltage VEXT_DIV of FIG. 6. In this case, the first delay line 1823_3 may delay the command pulse CMD Pulse in response to the external voltage VEXT_DIV.

The second delay line 1823_4 may include a plurality of delay cells. The command pulse CMD Pulse may be provided as an input of the second delay line 1823_4, and a reference voltage IVC may be provided as a control voltage. Accordingly, a delay corresponding to the reference voltage IVC may occur with respect to the command pulse CMD Pulse. Here, the reference voltage IVC may correspond to the reference voltage VREF_EV of FIG. 6. For example, the first reference voltage VREF_H of FIG. 6 may be provided as the reference voltage IVC. In this case, the second delay line 1823_4 may delay the command pulse CMD Pulse by the first delay time in response to the first reference voltage VREF_H. For example, the second reference voltage VREF_M of FIG. 6 may be provided as the reference voltage IVC. In this case, the second delay line 1823_4 may delay the command pulse CMD Pulse by the second delay time in response to the second reference voltage VREF_M. For example, the third reference voltage VREF_L of FIG. 6 may be provided as the reference voltage IVC. In this case, the second delay line 1823_4 may delay the command pulse CMD Pulse by the third delay time in response to the third reference voltage VREF_L. For example, the fourth reference voltage VREF_LL of FIG. 6 may be provided as the reference voltage IVC. In this case, the second delay line 1823_4 may delay the command pulse CMD Pulse by the fourth delay time in response to the fourth reference voltage VREF_LL. The first to fourth delay times may be different from each other.

The first phase detector PD1 may be connected to a first node N1 of the first delay line 1823_3 and may be connected to a second node N2 of the second delay line 1823_4. The first phase detector PD1 may compare the phase at the first node N1 and the phase at the second node N2 and provide the comparison result to the binary decoder 1823_5.

The second phase detector PD2 may be connected to the first node N1 of the first delay line 1823_3 and may be connected to a third node N3 of the second delay line 1823_4. The second phase detector PD2 may compare the phase at the first node N1 and the phase at the third node N3 and provide the comparison result to the binary decoder 1823_5.

The third phase detector PD3 may be connected to the first node N1 of the first delay line 1823_3 and may be connected to the output terminal of the second delay line 1823_4. The third phase detector PD3 may compare the phase at the first node N1 and the phase at the output terminal of the second delay line 1823_4, and provide the comparison result to the binary decoder 1823_5.

The binary decoder 1823_5 may receive information about the phase difference from the first to third phase detectors PD1 to PD3, convert it into a digital signal, and output the digital signal.

The D flip-flop 1823_6 may receive a digital signal from the binary decoder 1823_5 and store the digital signal. The D flip-flop 1823_6 may output the stored digital value at a rising edge or a falling edge of the delay pulse received from the output terminal of the first delay line 1823_3.

As described above, the external voltage detector 1823 according to embodiments of the inventive concepts may be implemented in ADC or TDC form. However, this is illustrative, and the external voltage detector 1823 may be implemented in various other forms, such as a flash TDC or a hybrid ADC.

Figure 10:
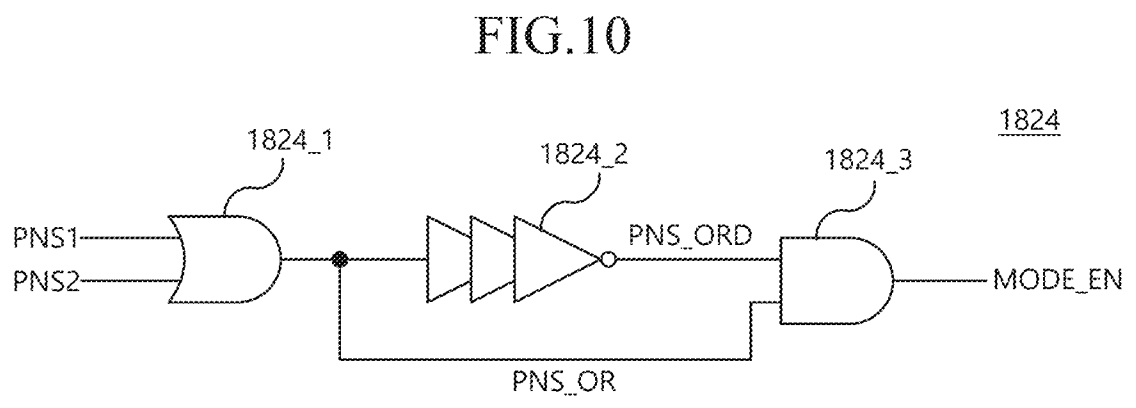
Figure 11:
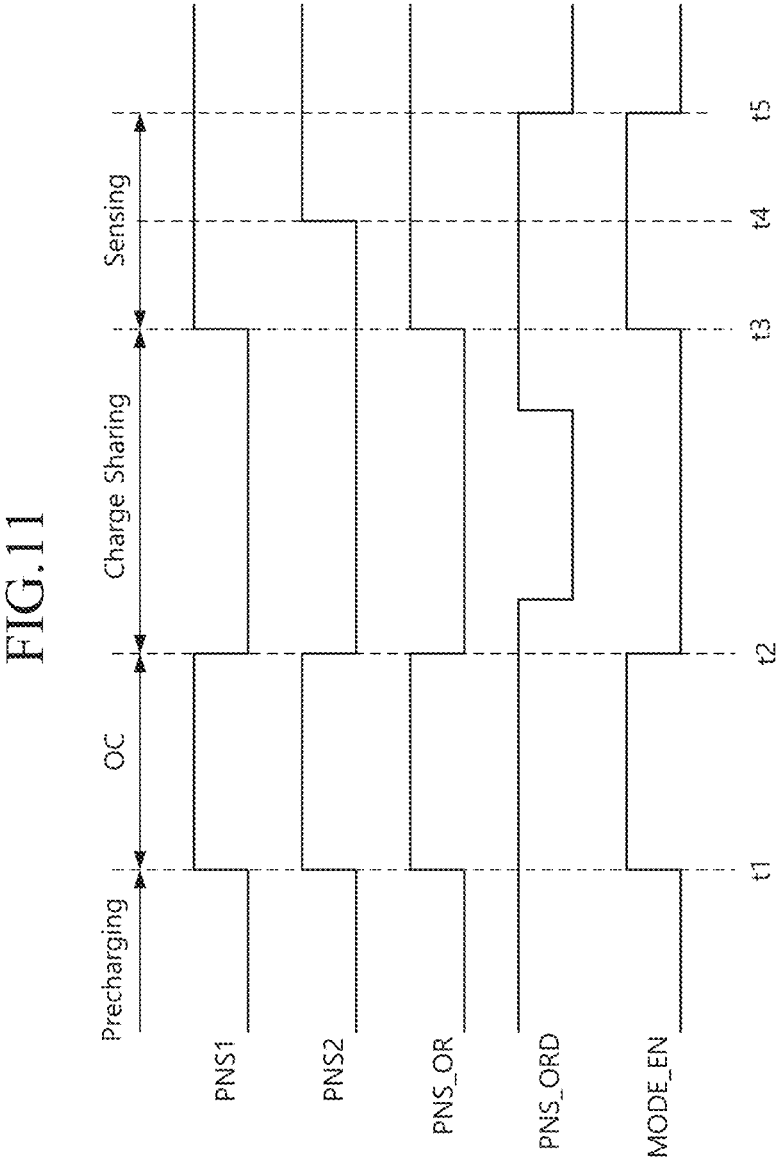
FIG. 11 illustrates a diagram of an example operation of external voltage detector 1823 in FIG. 5.

FIGS. 10 and 11 illustrate diagrams of an example configuration and operation of mode selector 1824 of FIG. 5. For convenience of description, it is assumed that the power switch circuit 1820_1 (see FIG. 5) is driven in the offset compensation and sensing modes during the refresh operation to compensate for current consumption.

Referring to FIG. 10, the mode selector 1824 may be implemented to include an OR gate 1824_1, a delay cell 1824_2, and an AND gate 1824_3.

The OR gate 1824_1 may receive a first pulse signal PNS1 and a second pulse signal PNS2. The first and second pulse signals PNS1 and PNS2 may be signals related to driving of the sense amplifier. For example, the first pulse signal PNS1 may be a signal related to the LA signal of the sense amplifier, and the second pulse signal PNS2 may be a signal related to the LAB signal of the sense amplifier. The OR gate 1824_1 may perform an OR operation on the first and second pulse signals PNS1 and PNS2 and output a third pulse signal PNS_OR.

The delay cell 1824_2 may receive the third pulse signal PNS_OR, delay and invert the third pulse signal PNS_OR, and output a fourth pulse signal PNS_ORD.

The AND gate 1824_3 may receive the third-pulse signal PNS_OR and the fourth pulse signal PNS_ORD. The AND gate 1824_3 may perform an AND operation on the third and fourth pulse signals PNS_OR and PNS_ORD and output the mode enable signal MODE_EN.

Referring to FIG. 11, at time point t1, an offset compensation operation OC may be performed. In this case, the levels of the LA signal and LAB signal of the sense amplifier may be changed, respectively. The first pulse signal PNS1 related to the LA signal and the second pulse signal PNS2 related to the LAB signal may transition from a low level to a high level. At time point t2, a charge sharing operation may be performed. In this case, the levels of the LA signal and LAB signal of the sense amplifier may be changed, respectively. The first pulse signal PNS1 related to the LA signal and the second pulse signal PNS2 related to the LAB signal may transition from a high level to a low level. Accordingly, both the third pulse signal PNS_OR and the fourth pulse signal PNS_ORD maintain a high level in the period t1 to t2, and consequently, the mode enable signal MODE_EN may be activated in the period of t1 to t2. The period of t1 to t2 in which the mode enable signal MODE_EN is activated may be the same as that in which the offset compensation mode is executed.

In addition, at time point t3, a sensing operation may be performed. In this case, the level of the LA signal of the sense amplifier may be changed. The first pulse signal PNS1 related to the LA signal may transition from a low level to a high level. At time point t4, the level of the LAB signal of the sense amplifier may be changed. The second pulse signal PNS2 related to the LAB signal may transition from a low level to a high level. Accordingly, during the period of t3 to t4, both the third pulse signal PNS_OR and the fourth pulse signal PNS_ORD may maintain a high level, and consequently, during the period of t3 to t4, the mode enable signal MODE_EN may be activated. The period of t3 to t4 during which the mode enable signal MODE_EN is activated may be the same as the period in which the sensing mode is executed.

As described above, the mode enable signal MODE_EN output by the mode selector 1824 may maintain a high level during a period in which the offset compensation mode and the sensing mode, which consume a lot of current, are executed. Accordingly, the power switch circuit 1820_1 (see FIG. 5) may compensate for the current consumed during a period in which the offset compensation mode and the sensing mode are executed in a feed-forward mode.

Figure 12:
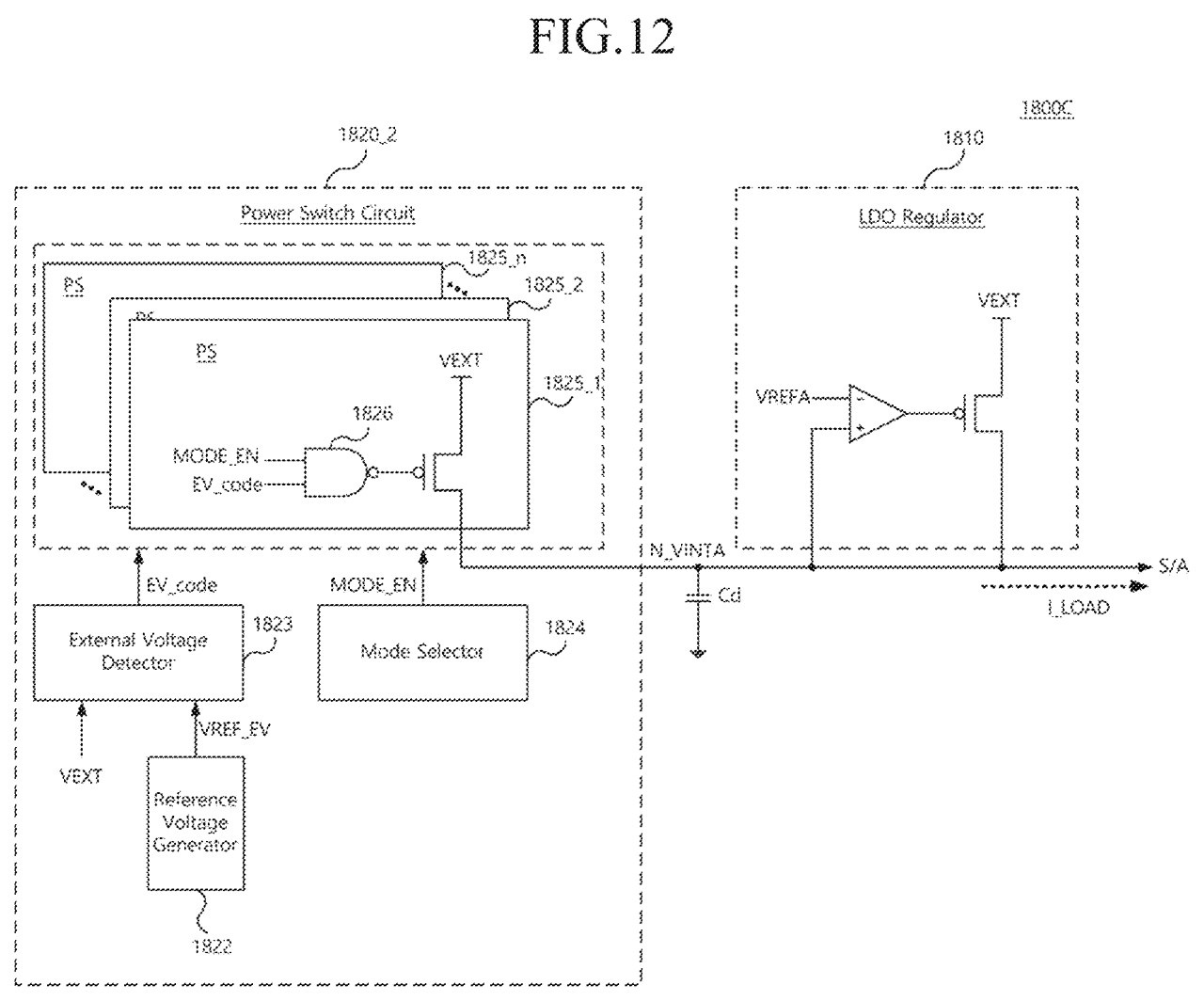
Figure 13:
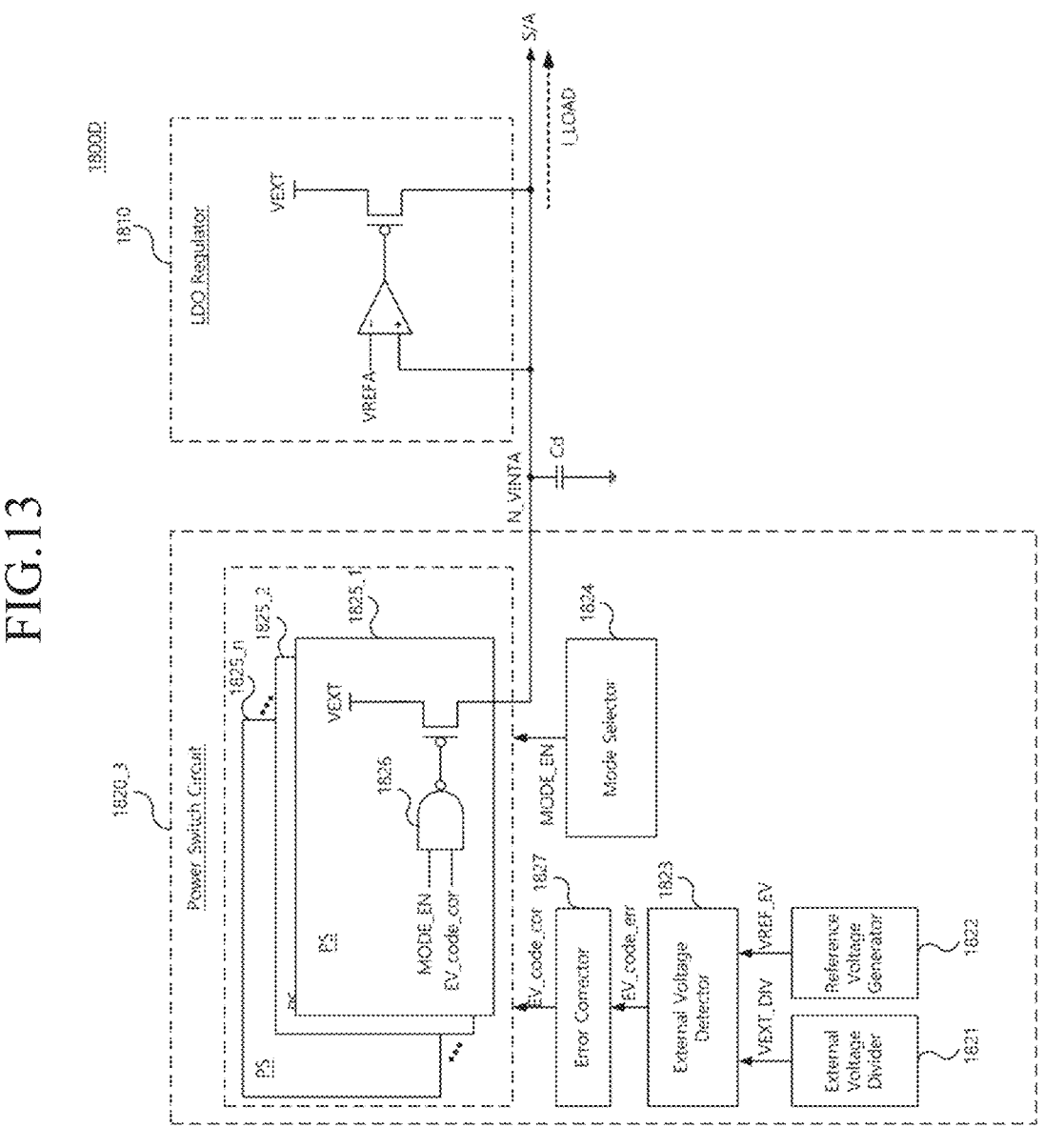
FIG. 13 illustrates a diagram of an example of internal voltage generator 1800D according to embodiments of the inventive concepts.
Figure 14:
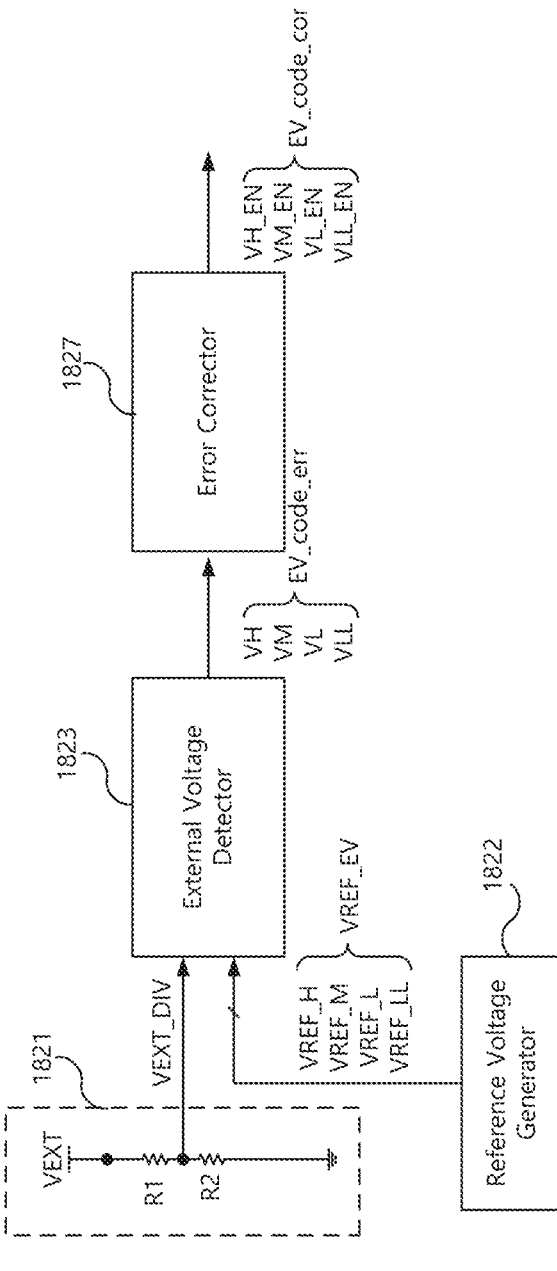
FIG. 14 illustrates a diagram including error corrector 1827 of FIG. 13.
Figure 15:
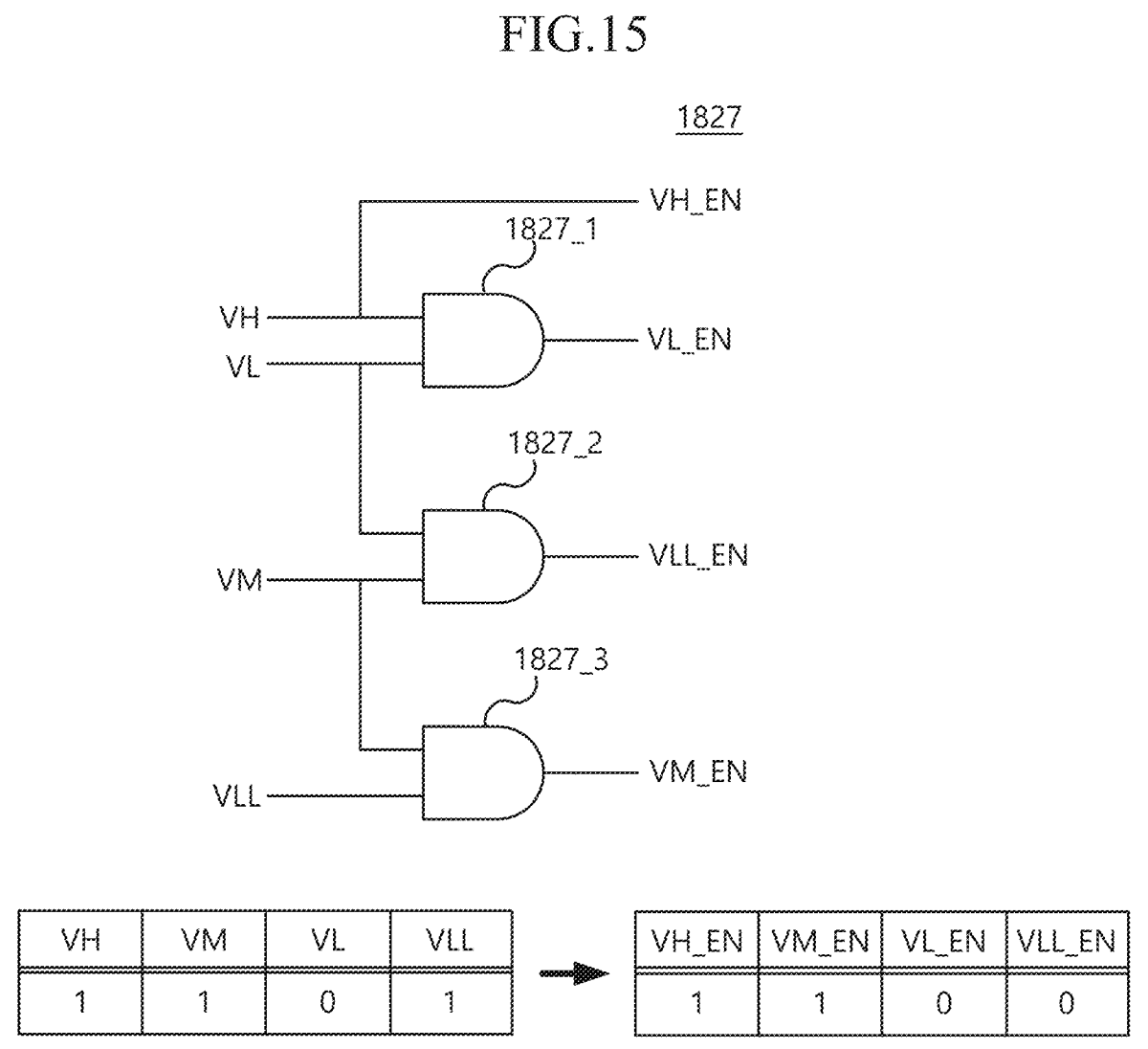

FIGS. 12 to 15 illustrate diagrams of other examples of internal voltage generator 1800 of FIG. 1. In detail, FIG. 12 illustrates a diagram of an example of an internal voltage generator 1800C according to another embodiment of the inventive concepts. FIG. 13 illustrates a diagram of an example of internal voltage generator 1800D according to another embodiment of the inventive concepts, and FIGS. 14 and 15 illustrate diagrams of an example of the configuration and operation of an error corrector 1827 of FIG. 13. The internal voltage generators 1800C and 1800D of FIGS. 12 to 15 are similar to the internal voltage generator 1800B of FIG. 5. Therefore, the same or similar components will be denoted by the same or similar reference numerals, and redundant description thereof will be omitted hereinafter.

Referring to FIG. 12, unlike the internal voltage generator 1800B of FIG. 5 including the external voltage divider 1821, the internal voltage generator 1800C of FIG. 12 does not include external voltage dividers. In this case, the external voltage detector 1823 may generate the external voltage code EV_code by directly receiving the external voltage VEXT and comparing the external voltage VEXT with the reference voltage VREF_EV.

Referring to FIG. 13, unlike the internal voltage generator 1800B of FIG. 5, the internal voltage generator 1800D of FIG. 13 may further include error corrector 1827. For example, the error corrector 1827 may receive an external voltage code EV_code_err including error information, correct the external voltage code EV_code_err, and output the corrected external voltage code EV_code_cor.

In more detail with reference to FIGS. 14 and 15, the external voltage codes (EV_code_err) output by the external voltage detector 1823 may include the first to fourth external voltage codes VH, VM, VL, and VLL, and among them, an error may occur in the fourth external voltage code VLL. In this case, the error corrector 1827 may correct an error generated in the fourth external voltage code VLL and output the corrected external voltage code EV_code_cor. The corrected external voltage code EV_code_cor may include corrected first to fourth external voltage codes VH_EN, VM_EN, VL_EN, and VLL_EN.

In an embodiment, the error corrector 1827 may be implemented in the form of bubble error correction. For example, as shown in FIG. 15, the error corrector 1827 may be implemented to include a plurality of AND gates 1827_1 to 1827_3. For example, the first AND gate 1827_1 may receive the first and third external voltage codes VH and VL, perform an AND operation on them, and output the corrected third external voltage code VL_EN. The second AND gate 1827_2 may receive the second and third external voltage codes VM and VL, perform an AND operation on them, and output the corrected fourth external voltage code VLL_EN. The third AND gate 1827_3 may receive the second and fourth external voltage codes VM and VLL, perform an AND operation on them, and output the corrected second external voltage code VM_EN. However, this is illustrative, and the error corrector 1827 may be implemented in various forms other than the bubble error correction form. As shown, in the case that the EV_code_err included external voltage codes VH=1, VM=1, VL=0 and VLL=1, the error corrector 1827 may provide corrected external voltage code EV_code_cor VH_EN=1, VM_EN=1, VL_EN=0 and VLL_EN=0.

Internal voltage generators 1800 of embodiments of the inventive concepts have been described as being applied to the memory device 1000A. However, this is illustrative, and the internal voltage generators 1800 according to embodiment of the inventive concepts may be applied to and/or used with various devices other than internal voltage generators.

Figure 16:
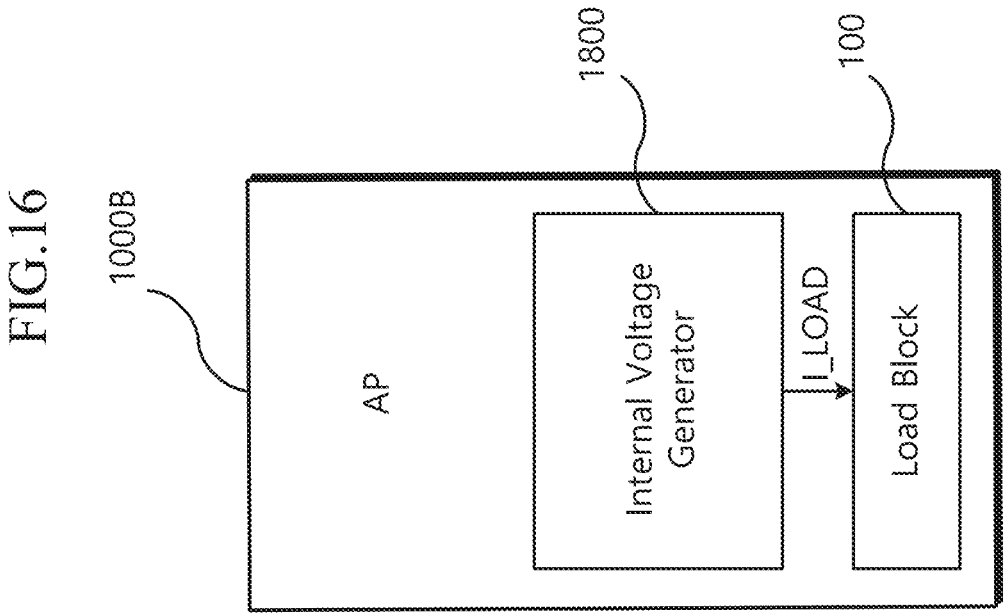
FIG. 16 illustrates a diagram of an example of application processor 1000B according to embodiments of the inventive concepts.

FIG. 16 illustrates a diagram of an example application processor 1000B according to embodiments of the inventive concepts.

Referring to FIG. 16, the application processor (AP) 1000B may be a processor used in a mobile device such as for example a smart phone, a tablet PC, and the like. The application processor 1000B may include various internal circuits. The application processor 1000B may include the internal voltage generator 1800 according to embodiments of the inventive concepts to stably supply current consumed in various internal circuits. The internal voltage generator 1800 may include an LDO regulator and a power switch circuit, and the LDO regulator and power switch circuit may provide the load current I_LOAD corresponding to the current consumed by a load block 100 to the load block 100.

In embodiments of the inventive concepts, the LDO regulator of the internal voltage generator 1800 may provide a load current in an operation mode in which current consumption is low among operation modes of the load block 100, and may operate in a feedback mode. The power switch circuit of the internal voltage generator 1800 may operate in a feed-forward mode and provide the load current according to an operation mode of the load block 100 that consumes large amount of current. Accordingly, the load current supplied to the load block 100 may be efficiently adjusted and provided to the load block 100.

Although the internal voltage generator 1800 is illustrated as being disposed inside the application processor 1000B in FIG. 16, embodiments are not limited thereto and the internal voltage generator 1800 may be arranged outside the application processor 1000B. In addition, the internal voltage generator 1800 of the inventive concepts may provide load current to load blocks of various devices.

The inventive concepts may include not only the above-described embodiments, but also simple design changes or easily changeable embodiments. In addition, the inventive concepts may include techniques that can easily modify and implement the embodiments. Therefore, the scope of the inventive concepts should not be limited to the above-described embodiments, but should be defined by the claims described below as well as the claims and equivalents.

What is claimed is:

1. A voltage generator comprising:
an LDO regulator configured to supply a first current to an internal voltage node of a sense amplification circuit as feedback control based on a voltage level of the internal voltage node; and a power switch circuit including a plurality of power switches each having one end connected to an external voltage and an opposite end connected to the internal voltage node, and configured to supply a second current to the internal voltage node as feed-forward control based on a number of activated sense amplifiers of the sense amplification circuit.

2. The voltage generator of claim 1, wherein the LDO regulator or the power switch circuit is configured to selectively supply the first and second currents to the internal voltage node based on an amount of current consumed by the sense amplification circuit connected to the internal voltage node.

3. The voltage generator of claim 2, wherein the power switch circuit is configured to supply the second current to the internal voltage node when executing an offset compensation mode or a sensing mode.

4. The voltage generator of claim 2, wherein the LDO regulator is configured to supply the first current to the internal voltage node when executing a precharge mode or a restore mode.

5. The voltage generator of claim 1, wherein the power switch circuit comprises a plurality of power switches, and each of the plurality of power switches comprises:

a NAND gate configured to receive a mode enable signal and an external voltage code; and a transistor configured to electrically connect the external voltage to the internal voltage node based on an output value of the NAND gate.

6. The voltage generator of claim 5, wherein the power switch circuit further comprises a mode selector configured to generate the mode enable signal, and wherein the mode enable signal is activated to a high level when an offset compensation mode and a restore mode are executed.

7. The voltage generator of claim 6, wherein the mode selector comprises:

an OR gate configured to receive a first pulse signal and a second pulse signal, and output a third pulse signal based on an OR operation on the first pulse signal and the second pulse signal;

a delay cell configured to receive the third pulse signal and delay the third pulse signal to output a fourth pulse signal; and an AND gate configured to receive the third pulse signal and the fourth pulse signal, and output the mode enable signal based on an AND operation on the third pulse signal and the fourth pulse signal.

8. The voltage generator of claim 7, wherein each of the first pulse signal and the second pulse signal transitions from a low level to a high level at a first time point, and transitions from a high level to a low level at a second time point, and a period between the first time point and the second time point corresponds to an execution period of the offset compensation mode.

9. The voltage generator of claim 7, wherein the first pulse signal transitions from a low level to a high level at a first time point, the second pulse signal transitions from a low level to a high level at a second time point later than the first time point, and a period between the first time point and the second time point corresponds to an execution period of a sensing mode.

10. The voltage generator of claim 5, wherein the power switch circuit further comprises an external voltage detector configured to generate the external voltage code, and the external voltage detector is configured to generate the external voltage code based on a result of comparing the external voltage with a reference voltage.

11. The voltage generator of claim 10, wherein the reference voltage comprises a plurality of reference voltages, and the external voltage detector comprises:

a plurality of comparators each configured to receive the external voltage and respective reference voltages from among the plurality of reference voltages having different levels, and provide comparison result values based on the external voltage and the respective reference voltages; and a binary decoder configured to generate the external voltage code by decoding the comparison result values received from the plurality of comparators.

12. The voltage generator of claim 10, wherein the external voltage detector comprises:

a first delay line corresponding to the external voltage;

a second delay line corresponding to the reference voltage;

at least one phase detector detecting a phase difference between the first delay line and the second delay line, and providing a phase value output based on the phase difference;

a binary decoder outputting a digital signal based on the phase value output from the at least one phase detector; and a D flip-flop that receives the digital signal and outputs the external voltage code in synchronization with an output signal from the first delay line.

13. The voltage generator of claim 5, wherein the power switch circuit further comprises an error corrector configured to correct an error of the external voltage code.

14. The voltage generator of claim 13, wherein the error corrector comprises a plurality of AND gates and is configured to correct the error of the external voltage code based on a bubble error correction technique.

15. A memory device comprising:

a memory cell array including a plurality of memory cells;

a sense amplification circuit configured to read out data stored in the memory cell array; and an internal voltage generator configured to provide an internal voltage to the sense amplification circuit, wherein the internal voltage generator is configured to compensate for a current consumed by the sense amplification circuit by selecting either feedback control or feed-forward control according to an operation mode of the sense amplification circuit, and wherein the internal voltage generator comprises:

an LDO regulator configured to supply a first current to an internal voltage node of the sense amplification circuit as the feedback control based on a voltage level of the internal voltage node; and a power switch circuit including a plurality of power switches each having one end connected to an external voltage and an opposite end connected to the internal voltage node, and configured to supply a second current to the internal voltage node as the feed-forward control based on a number of activated sense amplifiers of the sense amplification circuit.

16. The memory device of claim 15, wherein the power switch circuit is configured to compensate for the current consumed by the sense amplification circuit when executing an offset compensation mode or a sensing mode.

17. The memory device of claim 15, wherein the LDO regulator is configured to compensate for the current consumed by the sense amplification circuit when executing a precharge mode or a restore mode.

18. The memory device of claim 15, wherein the power switch circuit comprises a plurality of power switches, and each of the plurality of power switches comprises:

a NAND gate configured to receive a mode enable signal and an external voltage code; and a transistor configured to electrically connect the external voltage to the internal voltage node based on an output value of the NAND gate.

19. The memory device of claim 15, wherein the power switch circuit further comprises a mode selector configured to generate the mode enable signal, and wherein the mode enable signal is activated to a high level when an offset compensation mode and a restore mode are executed.

20. The memory device of claim 19, wherein the mode selector comprises:

an OR gate configured to receive a first pulse signal and a second pulse signal, and output a third pulse signal based on an OR operation on the first pulse signal and the second pulse signal;

a delay cell configured to receive the third pulse signal and delay the third pulse signal to output a fourth pulse signal; and an AND gate configured to receive the third pulse signal and the fourth pulse signal, and output the mode enable signal based on an AND operation on the third pulse signal and the fourth pulse signal.

* * * * *